United States Patent [19]
Alemanni

[11] Patent Number: 4,620,632
[45] Date of Patent: * Nov. 4, 1986

[54] CARRIERS FOR PIN GRID ARRAY

[76] Inventor: James C. Alemanni, 3917 Sherbourne Dr., Oceanside, Calif. 92056

[*] Notice: The portion of the term of this patent subsequent to Oct. 29, 2002 has been disclaimed.

[21] Appl. No.: 791,216

[22] Filed: Oct. 25, 1985

Related U.S. Application Data

[63] Continuation-in-part of Ser. No. 684,847, Dec. 21, 1984, Pat. No. 4,549,651.

[51] Int. Cl.⁴ ............................................. B65D 73/02
[52] U.S. Cl. .................................. 206/329; 206/331; 206/560
[58] Field of Search ............... 206/329, 328, 331, 334, 206/560, 562, 563, 564

[56] References Cited

U.S. PATENT DOCUMENTS

| | | | |
|---|---|---|---|
| 3,605,062 | 9/1971 | Tinkelenberg | 206/329 |
| 3,653,498 | 4/1972 | Kisor | 206/331 |
| 3,701,079 | 10/1972 | Bowden et al. | 206/329 |
| 3,977,522 | 8/1976 | Van der Aker et al. | 206/331 |
| 4,026,412 | 5/1977 | Henson | 206/331 |
| 4,073,381 | 2/1978 | Patterson | 206/331 |
| 4,379,505 | 4/1983 | Alemanni | 206/331 |
| 4,549,651 | 10/1985 | Alemanni | 206/331 |

Primary Examiner—Joseph Man-Fu Moy
Attorney, Agent, or Firm—Morland C. Fischer

[57] ABSTRACT

One and two-part carriers for a pin grid array having a body with a plurality of pins projecting from at least one face of the body. Certain ones of the carriers include an outer frame for extending around the perimeter of a separate removable carrier insert on which the pin grid array is releasably supported. The carrier insert has a recessed base for supporting the body of the pin grid array and an array of holes in a grid pattern through which the pins project when the body of the pin grid array is supported on the base. Resiliently flexible retention fingers at opposite ends of the carrier base engage the body of the supported pin grid array to retain it on the carrier insert base. The flexible retention fingers are bendable away from the carrier insert base for releasing engagement with the body of the supported pin grid array when either placing the pin grid array in the carrier insert or removing it from the carrier insert. Resilient clips on opposite inside faces of the frame cooperate with cam surfaces on opposite outer faces of the carrier insert for releasably attaching the carrier insert base to the inside of the outer frame in a snap lock to support the carrier insert inside the frame. Certain other ones of the carriers are of unitary construction, such that the carrier insert is fixedly connected within the outer frame. In some of the carriers, the retention fingers are split into bendable first and second halves so as to engage pin grid array bodies of different thicknesses.

21 Claims, 21 Drawing Figures

CARRIERS FOR PIN GRID ARRAY

CROSS-REFERENCES TO RELATED PATENT APPLICATIONS

This patent application is a continuation-in-part of application Ser. No. 684,847 filed Dec. 21, 1984 now U.S. Pat. No. 4,549,651.

BACKGROUND OF THE INVENTION

1. Field of the Invention

This invention relates to carriers for pin grid array devices, and more specifically, to one and two-part carriers which provide extraordinary simplification, reduced cost, and other advantages in procedures for handling pin grid array devices supported on carriers.

2. Prior Art

A pin grid array is an integrated circuit device generally having a flat and square-shaped body with an array of electrical terminal pins projecting from a face of the body. A common pin grid array configuration comprises a square-shaped body with two or more parallel rows of pins extending around the perimeter of the body to form a grid pattern, with an integrated circuit chip in a central region of the body inside the pin grid pattern at the perimeter. Other pin grid array configurations also can be used.

A pin grid array is commonly manufactured in a wide variety of body sizes, which can vary from approximately 1.060 inch square to approximately 1.600 inch square, or larger, for example. The number of pins on a pin grid array also can vary, from nine pins per side to fifteen pins per side, or more, for example.

Pin grid arrays are commonly placed in individual carriers to protect them during subsequent handling steps. While placed in such carriers, the pin grid arrays can be marked and tested, for example. One carrier for a pin grid array comprises a base with an opening in its center and an array of holes around the central opening in a grid pattern to receive the pins of the pin grid array. The body of the pin grid array is mounted in a square-shaped recess on the opposite side of the carrier base, while the integrated circuit (chip) is retained in the central opening of the carrier. Flexible retaining clips adjacent the rectangular recess clip onto opposite sides of the body for holding it in place on the carrier base. The clips can be spread apart by mechanical means when removing the pin grid array from the carrier.

This type of carrier requires a different carrier design for each different pin grid array device. Inasmuch as pin grid arrays are available in different body sizes, the retaining mechanism in each carrier must be arranged to connect to a pin grid array body of a specific size, while the hole pattern in the carrier must match the array of pins on each different pin grid array. Tooling or machinery used to open the carrier also must vary for each different sized pin grid array. The opening mechanism must engage the retaining clips at their correct locations on each different type of carrier device to remove its particular sized pin grid array.

The present invention provides one and two-part pin grid array carriers which avoid the disadvantages of the conventional pin grid array carriers. The carriers of this invention greatly reduce production costs for constructing pin grid array carriers capable of carrying pin grid arrays of various size. In addition, the carriers of the present invention permit pin grid arrays to be removed from the carrier independently of the size of the pin grid array body so that a common opening mechanism can be used for all pin grid array sizes. In addition, the pin grid array can be removed along with one part of the two-part carrier. This removable part protects the pin grid array during subsequent testing and other handling steps while not interfering with such testing as is commonly the case with the conventional carriers. The carriers of this invention have further advantages when compared with the conventional pin grid array carriers, and these further advantages are described below.

SUMMARY OF THE INVENTION

Briefly, one embodiment of this invention comprises a two-part carrier for a pin grid array having a body with a plurality of pins projecting from at least one face of the body. The two-piece carrier comprises an outer carrier frame having rigid side walls extending around the perimeter of an open space within the frame. A carrier insert comprises a base for supporting the body of the pin grid array. The base has an array of holes through which the pins project when the body of the pin grid array is supported on the carrier insert. Flexible retention means on the carrier base engage the body of the pin grid array for retaining it in the carrier. The flexible retention means are bendable away from the base of the carrier insert for releasing engagement with the body of the pin grid array. Releasable fastening means cooperate between the base of the carrier insert and the side walls of the outer frame for connecting the base to the frame in a snap lock to support the carrier insert inside the open space of the frame so the pin grid array is retained on the carrier insert with the frame extending around the perimeter of the carrier insert. The releasable fastening means are exposed in the snap locked position for contact with an external force applying means to release the fastening means from the snap locked position to remove the carrier insert from the frame.

The carrier insert can be made in different sizes to match the shape and size of different pin grid arrays. The outer frame is common to all pin grid array sizes. The common frame greatly reduces the cost and materials for producing carriers capable of fitting pin grid arrays in various sizes. This is especially true for users who have a variety of sizes of pin grid array devices. When a user has a large volume of pin grid array devices in any one size, economies are achieved by simultaneous (family) molding of both the carrier insert and the frame in a multi-cavity mold. In addition, the fastening means for releasably connecting the carrier insert to the outer frame are commonly located for all pin grid array carrier inserts. Thus, the same tooling and mechanism can be used to remove the carrier and pin grid array from the frame for all pin grid array sizes. The retention means for retaining the pin grid array on the carrier insert also is commonly located for all opening mechanisms so that the same mechanism can remove pin grid arrays of various sizes from their carrier inserts. Once the pin grid array is removed from the outer frame and retained in its carrier insert, the carrier insert protects the pin grid array during subsequent handling steps. The carrier insert also is shaped so as not to interfere with subsequent handling steps. It permits simplified testing of pin grid arrays, such as in a common burn-in socket, for example.

In a second embodiment of the invention, a two-part pin grid array carrier is provided with flexible retention fingers which extend from a movable carrier insert. Each retention finger is split into first and second halves. The retention finger halves may be independently rotated relative to one another and positioned to releasably engage respective pin grid array bodies having different thicknesses for retaining such pin grid arrays on the removable carrier insert.

In third and forth embodiments of the invention, an improved one-piece pin grid array carrier includes an outer carrier frame surrounding a flat carrier base, which frame and base are coextensively connected together to form a unitary pin grid array carrier. The one-part carrier is provided with flexible retention fingers which may be split into first and second halves so as to releasably engage pin grid array bodies having different thicknesses.

These and other aspects of the invention will be more fully understood by referring to the following detailed description and the accompanying drawings.

DESCRIPTION OF A PREFERRED EMBODIMENT

Figure 1:
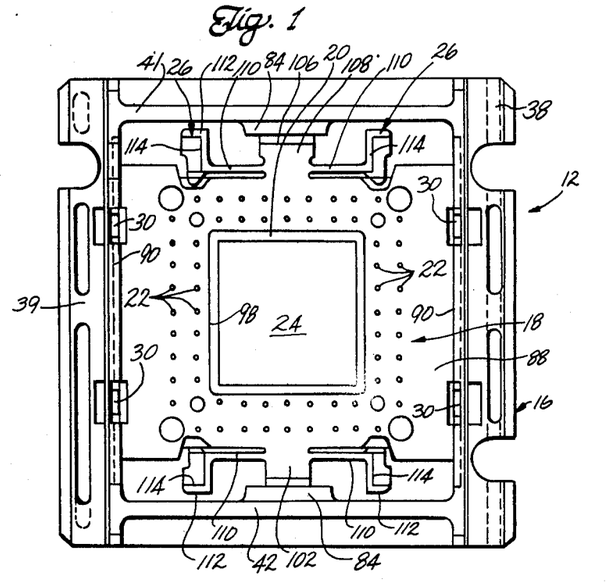
FIG. 1 is a top plan view showing an assembled two-part pin grid array carrier according to principles of a first embodiment of this invention.
Figure 2:
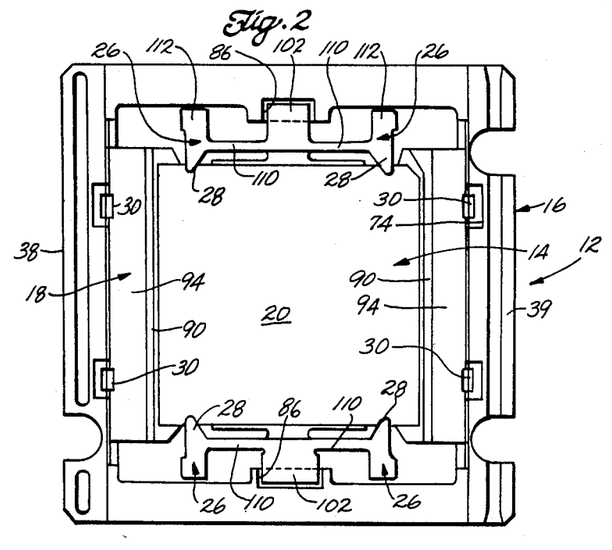
FIG. 2 is a bottom plan view showing the assembled pin grid array carrier of FIG. 1.

FIGS. 1 and 2 are top and bottom elevation views showing an assembled two-part pin grid array carrier 12 with a pin grid array 14 retained in the carrier 12. The two-part carrier is made of plastic and has a generally rectangular outer carrier frame 16 and a separate carrier insert 18 releasably connected to the inside of the outer frame so that the outer frame extends around the perimeter of the carrier insert.

Figure 10:
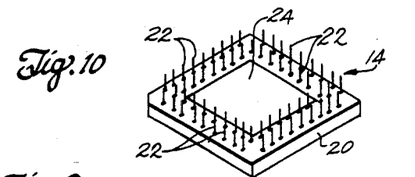
FIG. 10 is a perspective view illustrating a typical pin grid array used with the carriers of this invention.

Referring briefly to FIG. 10, the carrier of this invention provides means for retaining a pin grid array 14 of the type shown in FIG. 10, which includes a generally flat and square-shaped body 20 made from a material which is an electrical insulator. An array of electrical terminal pins 22 project from one face of body 20. An integrated circuit chip 24 is affixed to the central flat face side of the body. The integrated circuit may be affixed to either side of the body. The terminal pins provide easily accessible electrical leads for the integrated circuit when used in testing the integrated circuit or in later plugging the pin grid array into a printed circuit board, for example. In the illustrated embodiment, the pin grid array has an 11×11 matrix of terminal pins in which the pins are arranged in a grid pattern of two parallel rows extending adjacent each of the four outer edges of the body. The center of the body has a square-shaped open region for connection to the integrated circuit chip 24. Other embodiments of the pin grid array are possible, such as variations in the size or shape of the pin grid array body, or variations in the number and spacing of the electrical terminal pins. As mentioned above, the views of FIGS. 1 and 2 are referred to as top and bottom views of the carrier 12. For consistency in this description, the pin grid array 14 is described as having a top face shown in FIG. 1 and a bottom face shown in FIG. 2 (although it is recognized that those in the art commonly refer to the face from which the terminal pins 22 project as the bottom face of the device).

Referring again to FIGS. 1 and 2, the pin grid array 14 is shown placed in the assembled carrier of this invention. The carrier insert 18 has flexible retention fingers 26 with flanged projections 28 which overlap the bottom face of the pin grid array body 20 (as shown best in FIG. 2) to hold the pin grid array in the carrier insert 18. Flexible clips 30 on the inside walls of the outer frame 16 are releasably attached to the opposite outer edges of the carrier insert in a snap lock to releasably hold the carrier insert inside the carrier frame.

Figure 3:
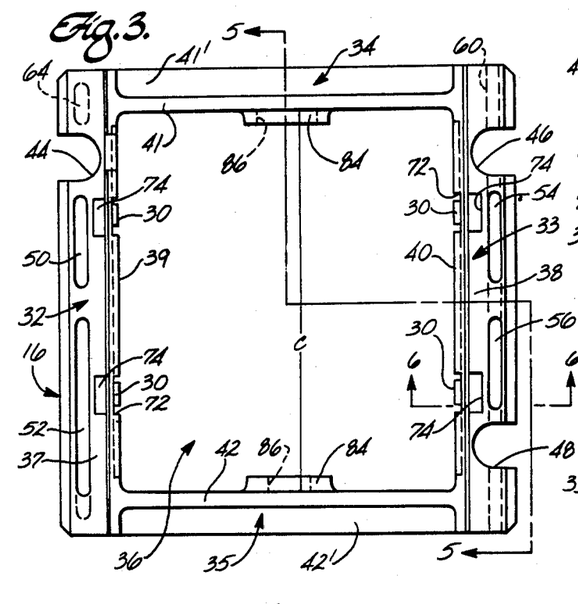
FIG. 3 is a top plan view showing the outer carrier frame of the pin grid array carrier.
Figures 4, 6:
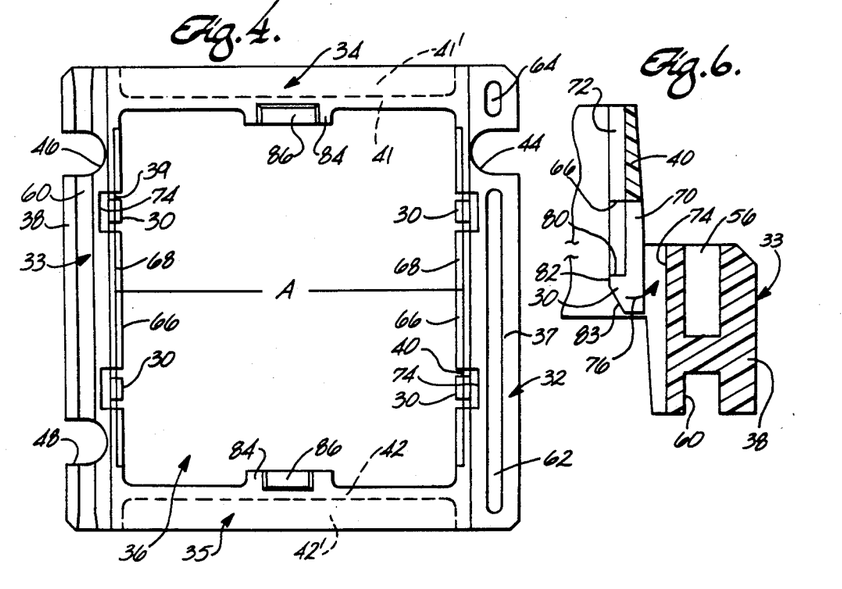
FIG. 4 is a bottom plan view showing the outer frame of the pin grid array carrier.
FIG. 6 is an enlarged cross-sectional view taken along lines 6—6 of FIG. 3.
Figure 5:
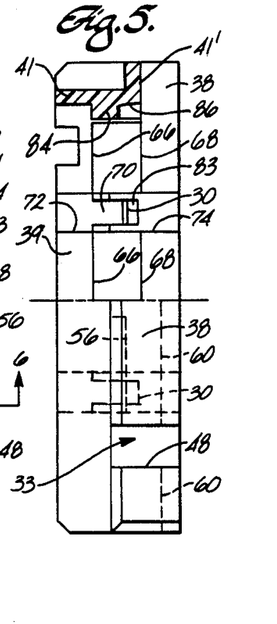
FIG. 5 is a side elevation view, partly in cross-section, taken along lines 5—5 of FIG. 3.

Detailed construction of the outer frame 16 is understood best by referring to FIGS. 3 through 6. FIG. 3 is a top view of the carrier frame and FIG. 4 is a bottom view in which the frame shown in FIG. 3 has been rotated 180 degrees. The outer frame is square, having long, narrow left and right side walls 32 and 33 extending parallel to one another along left and right sides of the frame, respectively, as the frame is viewed in FIG. 3. The frame also includes long, narrow first and second end walls 34 and 35 extending at right angles to the side walls and extending parallel to one another along opposite ends of the frame. The side and end walls of the frame extend around the perimeter of a rectangular open space 36 confined within the frame. In the preferred embodiment the frame is square in shape.

The left and right side walls 32 and 33 preferably have relatively wide flanged outer portions 37 and 38 respectively, on which the carrier frame rests. Relatively thin left and right upright wall sections 39 and 40 are integral with and extend above the flanged outer portions 37 and 38 of the side walls. This configuration of the side walls is best illustrated in the cross-sectional view of FIG. 6, which shows the thin upright wall sections 39 and 40 parallel to and inboard from the wider flanged outer portions 37 and 38 of the side walls. The first and second end walls 34 and 35 also have first and second relatively thin upright wall sections 41 and 42 at the same elevation and integral with the ends of the thin left and right upright wall sections 39 and 40. This forms a thin rectangular peripheral wall elevated above the flanged outer portions of the side walls which serve as long rails elevating the rectangular peripheral wall above the surface on which the rails rest to support the carrier frame.

A U-shaped slot 44 is located in the outer edge of the flanged outer wall portion 37 of the left side wall 32. A pair of spaced apart U-shaped slots 46 and 48 are located in the outer edge of the flanged outer portion 38 of the right side wall 33. Long, narrow depressions 50 and 52 are located in the top edge of the left flanged outer wall section 37, and long, narrow depressions 54 and 56 are located in the top edge of the right flanged wall section 38. These depressions are for weight reduction, to reduce mass during high temperature testing. A long, narrow notch 60 extends the length of the bottom face of the flanged outer wall section 38 of the right side wall 33. The notch provides polarity orientation and is an industry standard. Long and short notches 62 and 64, respectively, extend along the bottom face of the flanged outer wall section 37 of the left side wall 32. The first end wall 34 has a narrow outer ridge 41' extending at a right angle to the thin upright section 41 of the first end wall. The second end wall 42 has a narrow outer ridge 42' extending at a right angle to the thin upright section 42 of the second end wall. These provide structural integrity.

The number, size and positions of the slots, depressions and notches can vary and are merely shown as examples of means that cooperate with various types of mechanized equipment for handling the carrier in a well-known manner.

As described previously, the flexible clips 30 for fastening to the carrier insert 18 are located on the inside faces of the left and right frame side walls 32 and 33. In the illustrated embodiment, a pair of such clips are spaced apart along the length of each side wall, at locations about one-third and two-thirds of the distance along each side wall. A downwardly facing elongated upper shoulder 66 (shown best in FIG. 5) extends along the inside face of each thin upright wall section 39 and 40 of the left and right side walls 32 and 33. The clips 30 extend below the upper shoulders 66, as shown best in FIG. 6. Each upper shoulder 66 extends parallel to the bottom edge of its side wall and at a right angle to the vertical inside face of the thin upright wall section on which it is located. Each upper shoulder 66 is located about one-third the distance down from the top of the frame side wall. A similar narrow downwardly facing elongated lower shoulder 68 (shown best in FIG. 5) extends along approximately the lower one-third of each thin upright wall section 39 and 40 parallel to the upper shoulder 68. The lower shoulders 68 are recessed into the wall sections farther than the upper shoulders 66, so that both shoulders face downwardly.

Each clip 30 is on the bottom of an elongated resilient spring-like lever arm 70 extending vertically adjacent the inside face of the frame side wall. A separate narrow notch 72 is formed above each lever arm in the thin upright wall section of the side wall which supports the lever arm. This adds a degree of flexibility to each lever arm, as well as allowing the part to be molded. Each notch 72 extends the full depth of the frame side wall. That is, each notch also extends into the inside face of the flanged outer portions 37 and 38 of the frame side walls, which are spaced outwardly from the inside face of their thin upright wall sections 39 and 40. This portion of each notch is shown best at 74 in FIG. 6. This leaves an open space behind each lever arm and clip into which the lever arm can bend or rotate as illustrated by the arrow 76 in FIG. 6. About the bottom two-thirds of each lever arm is narrowed in width, as shown best in FIG. 5. Each clip 30 has a projection at the bottom of the flexible lever arm 70, and the clip projects inwardly toward the open space 36 within the frame. Each clip 30 includes an upwardly facing shoulder 80 extending at a right angle to the length of the lever arm 70, a narrow inside face 82 below the upper shoulder 80, and a downwardly and inwardly inclined ramp surface 83 below the upper shoulder 80. These details of the clips are best shown in FIG. 6.

The first and second end walls of the carrier frame include central projections 84 extending inwardly toward the central opening 36 within the frame. Each central projection extends about the lower one-half of the height of the end wall, and each projection has a recess 86 which faces downwardly and extends about one-half the height of the central projection.

Figure 7:
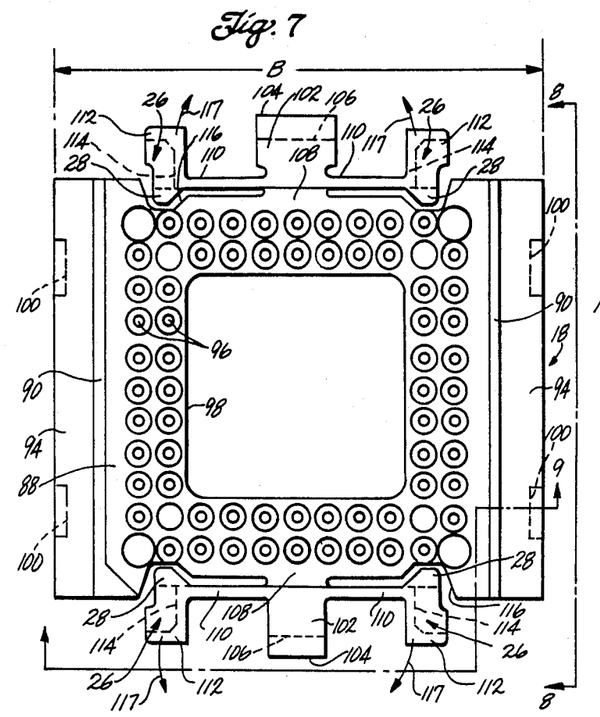
FIG. 7 is a top plan view showing the carrier insert of the pin grid array carrier.
Figure 8:
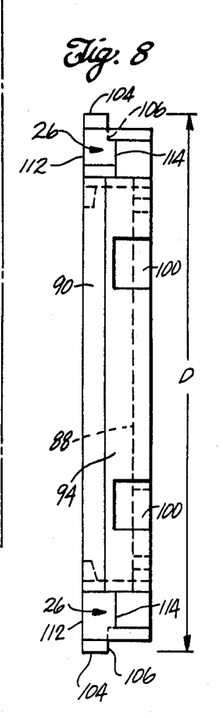
FIG. 8 is a side elevation view taken along lines 8—8 of FIG. 7.
Figure 9:
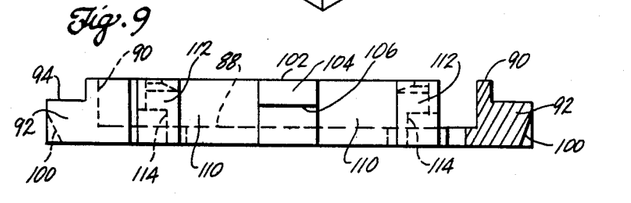
FIG. 9 is a side elevation view, partly in cross-section, taken along lines 9—9 of FIG. 7.

The carrier insert 18 is understood best by referring to FIGS. 7 through 9. The carrier insert has a thin and flat base 88 with side walls extending along outer edges of the base. The side walls are of composite configuration having thin upright wall sections 90 spaced inwardly from and extending parallel to the outer edges of the base. The thin upright wall sections 90 form the maximum height of the carrier insert. Flanged outer edge sections 92 of the side walls extend outward from the thin upright wall sections 90, and form upwardly facing right angle shoulders 94 extending along opposite sides of the base outwardly from and adjacent to the thin upright wall sections 90.

An array of holes 96 extends entirely through the depth of the base 88. In the illustrated embodiment the base has a large central square opening 98, and the holes extend in a grid pattern of two rows uniformly spaced apart along each of the four sides of the base adjacent the central opening 98. Each hole 96 is preferably countersunk or relieved in a similar manner with an enlarged upper section of each hole facing the side of the base illustrated in FIG. 7. The illustrated embodiment is a carrier insert for a pin grid array having a 11×11 array of terminal pins as illustrated in FIG. 10.

A spaced-apart pair of downwardly and inwardly angled notches 100 (shown best in FIG. 9) are located in the outer face of each outer side wall section 92 of the side walls of the carrier insert. These notches have a width sufficient to cooperate with the projecting spring-biased clips 30 of the lever arms 70 to provide a cam surface engaged by the clips for snap locking the carrier insert inside the outer frame as described in more detail below.

A pair of center alignment tabs 102 are located at opposite ends of the base 88, at an elevation above the top surface of the base. Each alignment tab has a flanged outer tip 104 with a downwardly facing right angle shoulder 106. The center alignment tabs are offset outwardly from the outer edges of the base 88 by a narrow neck 108 which is integral with the base and which supports the alignment tab outwardly from the base.

Each alignment tab 102 supports the retention fingers 26 which comprise narrow, upright legs 110 extending in opposite directions away from the tab parallel to the adjacent end of the base 88. The legs 110 have flanged tips 112 which project outwardly from the legs at a right angle away from the outer edge of the base 88. The narrow, thin legs 110 are at a height approximately the same as the thin, upright wall sections 90 along opposite sides of the base, so that the legs of the retention fingers form end walls at opposite ends of the base 88. The flanged tips 112 have recessed regions 114 on their underside that form openings facing downwardly and laterally outwardly away from the central axis of the base. As shown best in FIG. 7, the inside ends of the retention fingers have the inward projections 28 that overlap the bottom base of a pin grid array when the array is retained in the carrier insert. Opposite ends of the base 88 also include a pair of recessed sections 116 located below the projections 28. The retention fingers are bendable outwardly from the outer edges of the base 88 under application of an external bending force generally horizontally outwardly against the outer face of the recess 114 in the flanged tip of each retaining finger. The arrows 117 in FIG. 7 illustrate the direction in which the retention fingers are able to bend. When the external bending force is released the resiliency of the legs 110 automatically returns the retaining fingers to the normal position shown in FIGS. 1, 2 and 9.

In using the two-part carrier, the pin grid array is first placed in the carrier insert. Although a variety of techniques can be used, in one technique the pin grid array is preferably held by a vacuum head (not shown) attached to the body of the pin grid array. The four retention fingers 26 at opposite ends of the carrier insert are simultaneously pushed horizontally outwardly from the base 88 of the carrier insert by an actuating mechanism that includes four pins (not shown) for applying an outward force to the recessed regions 114 at the tips 112 of the retention fingers. This bends the fingers simultaneously away from the recessed region within the carrier insert, and the fingers are retained in this position until the pin grid array is placed on the base 88. With the resilient fingers held in their outward positions, and the carrier insert held in the upwardly facing position shown in FIG. 7, the vacuum head is lowered to place the body 20 of the pin grid array in the recessed central portion of the carrier insert with sufficient downward force to extend the pins 22 of the pin grid array downwardly through the holes 96 in the base 88. Once the pin grid array is in place in the carrier, the vacuum head is retracted and the outward force from the pins at the tips of the fingers is released. This allows the fingers to immediately return to their normal positions in which the flanged inside portions 28 of the retention fingers 26 extend over the bottom face of the pin grid array body to hold the pin grid array in the carrier. With the pin grid array in place in the carrier, the side walls 90 of the carrier insert extend along opposite sides of the pin grid array body, and the legs 110 of the retention fingers extend adjacent the outer ends of the pin grid array body. The vertical distance between the flanged tips 28 of the retention fingers and the base 88 of the carrier insert matches the thickness of the pin grid array body to hold the pin grid array within the carrier insert without significant motion of the pin grid array in the carrier. With the pin grid array in place in the carrier insert, the integrated circuit 24 of the pin grid array is exposed within the central opening 98 of the carrier, as shown in FIG. 1.

Once the pin grid array is placed in the carrier insert, the carrier insert is next snap locked into a fixed position within the outer carrier frame 16. Alternatively, the carrier insert can be snap locked into the outer frame before the pin grid array device is placed in the carrier insert. In the description to follow, it is assumed that the outer frame 16 is held in the upwardly facing position shown in FIGS. 1 and 3, and the carrier insert 18 is held in a position reversed 180 degrees from that shown in FIG. 7. The carrier insert is positioned inside the frame so that the side walls 94 of the carrier insert are positioned adjacent the clips 30 on the inside walls 39 and 40 of the outer frame. This positions the tapered cam surfaces 100 on the side walls 94 of the carrier insert against the ramp surfaces 83 of the clips 30 so that an external upward force applied to the bottom of the carrier insert causes the surfaces 83 and the flanged tips 82 of the clips 30 to ride down and outwardly on the cam surfaces 100, as the carrier insert is pushed upwardly into the frame. This bends the lever arms 70 of the clips outwardly toward the adjacent open spaces 74 of the sides of the frame. Continued upward force on the carrier insert finally causes the edges of the carrier to pass around the flanged tips of the clips, while the natural spring bias of the clips causes the lever arms 70 to spring back and the flanged tips of the clips to hook onto the underside of the shoulders 94 on the sides of the carrier insert, in a snap lock which holds the carrier insert in a fixed position inside the carrier frame. The shoulders 80 of flanged portions 82 of the clips 30 are engaged with the underside of the shoulders 94 on carrier insert 18 to lock the carrier insert in the frame. In the locked position, the surface of the base 88 is engaged with the shoulders 66 on the inside face of the carrier frame. The spacing between the tops 80 of the flanged tips of the retaining clips and the underside of the shoulder 66 matches the thickness of the carrier insert side wall portions 92. This causes the clips to retain the base in a fixed position against the shoulders 66 to prevent movement of the insert once locked in the frame. With the carrier insert and pin grid array located inside the outer frame, the alignment tabs 102 project into the recessed portions 86 of the projections 84 at opposite ends of the carrier frame. This can provide a tongue and groove means for contact between these portions of the carrier insert and the frame to stabilize the carrier insert against vertical motion within the frame.

The two-part carrier makes it possible to mass produce carrier frames of a common size and configuration for a wide variety of pin grid array devices having different body sizes and pin grid arrangements. The carrier insert only needs to be constructed to match the particular pin grid array device, and different carrier inserts can then be inserted into the common frame. Regardless of the size and pin arrangement of the particular pin grid array, the various carrier inserts can all fit into the outer frame by positioning the cam surfaces 100 on each carrier insert to cooperate with the clips 30 on the frame in a snap lock. The clips are also positioned on the frame so that a common mechanism can engage the clips and apply an external force outwardly and downwardly into the locked clips to release them from engagement with the carrier insert when removing the carrier insert from the outer frame. Similarly, the retaining fingers 26 are positioned at opposite ends of the carrier insert so that they fit within the commom frame without interference. The retaining fingers also are positioned on each carrier insert so that a common mechanism can be used to engage the recessed sections 116 of the fingers and bend the fingers outwardly when removing the pin grid array from the carrier insert.

In the illustrated embodiment, only a few dimensions need to be fixed for the carrier frame to match cooperating dimensions of each carrier insert. For instance, in the illustrated embodiment the distance A between the inside faces of the frame side walls 90 beneath the shoulders 66, as illustrated in FIG. 4, is 1.54 inches; and the corresponding width B of each different carrier insert, independently of the size and pin arrangement of the particular pin grid array, is 1.539 inches. The distance C between the central alignment recessed regions 88 at opposite ends of the frame is 1.66 inches and the distance D between opposite ends of the tabs of the carrier insert also is approximately 1.66 inches. These dimensions are examples only, since the carrier can be produced in different sizes to accommodate pin grid arrays of differing dimensions. All carrier inserts, independently of the size of the pin grid array they carry, have their tapered cam surfaces 100 all configured and arranged so that the clips 30 on the carrier frame can engage the tapered surfaces and snap lock onto the carrier insert when the carrier insert is pushed into the frame.

The invention also permits the two parts of the carrier to be molded using different materials to provide ESD protection. The carrier insert may be molded in a variety of colors also for part identification.

The location of the retention clips is uniform for all variations of the carrier insert. When using the one-piece carrier of the prior art with its retention clip arrangement, tooling and machinery used to open the carrier had to vary for each different sized pin grid array device. The two-part carrier of this invention places the opening mechanism in the same physical location for all pin grid array devices thereby providing tooling commonality.

Furthermore, the two-part carrier allows the user to remove the frame from the exterior of the carrier insert and still have the pin grid array device in a mechanical, electrically protected carrier. This then allows the user to place the assembly in a burn-in socket of any size for testing the pin grid array. There are no obstructions over the top of the carrier insert while the pins of the pin grid array are exposed, which allows the socket of a burn-in tester to be placed over it so the pin grid array can be tested while retained in the carrier insert. The carrier insert also allows the user to ship the pin grid array protected in a less costly carrier, if desired. The carrier in this instance can be shipped in protective outer tubing, for example.

A further benefit is the use of less materials in constructing the assembled frame and carrier insert when compared with the prior art single piece carrier. The two-part frame and carrier insert also provides substantially more open space within the carrier which greatly improves heat dissipation from testing in a burn-in socket, for example.

Figure 11:
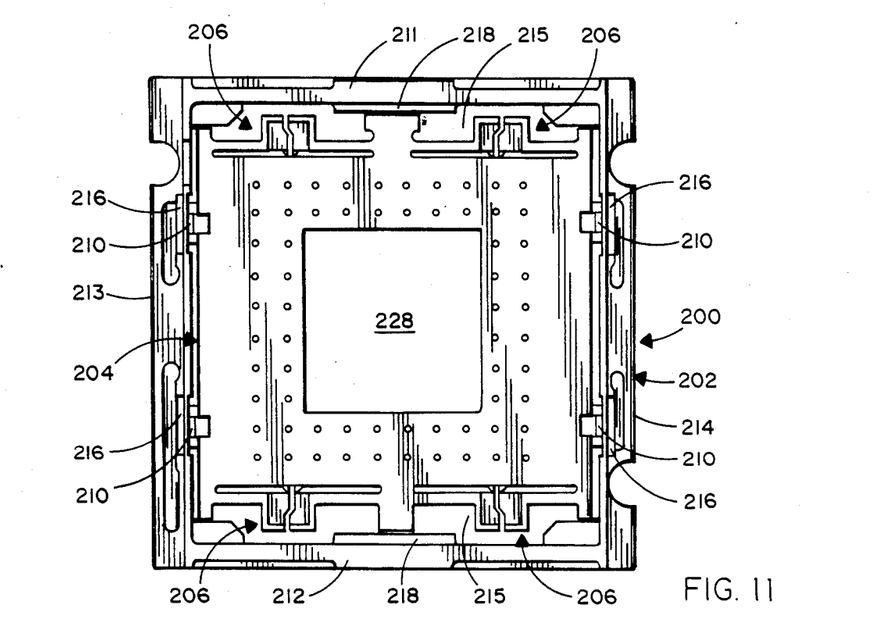
FIG. 11 is a top plan view showing an assembled two-part pin grid array carrier according to principles of a second embodiment of this invention.
Figure 12:
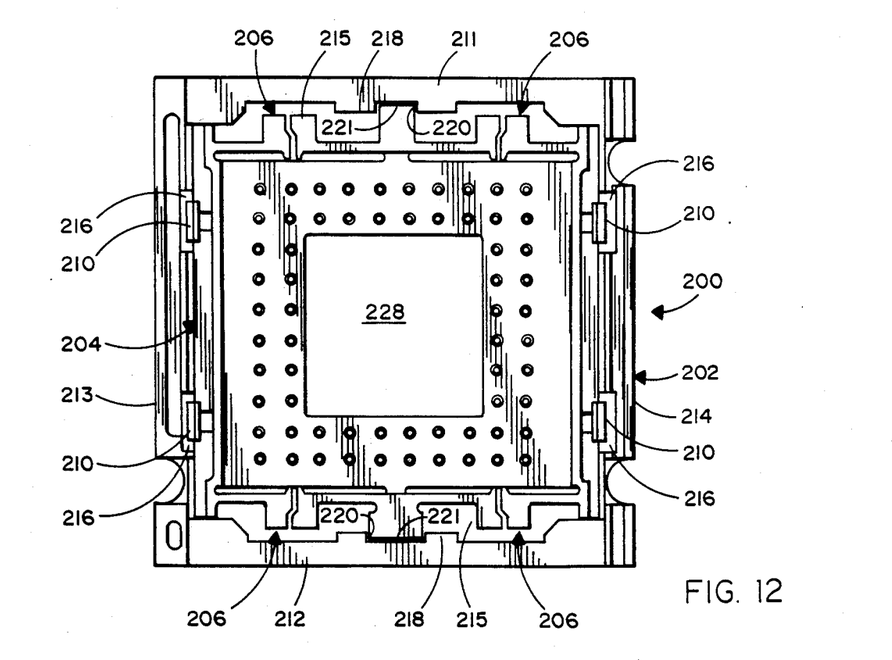
FIG. 12 is a bottom plan view showing the assembled pin grid array carrier of FIG. 11.
Figure 16:
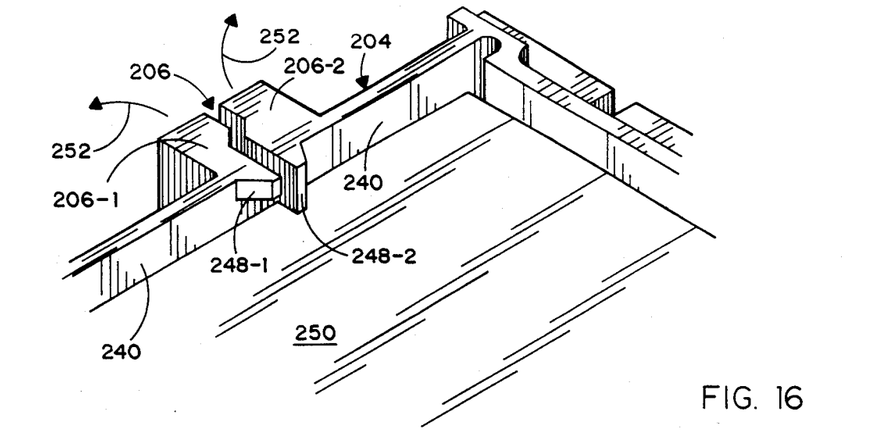
Figure 17:
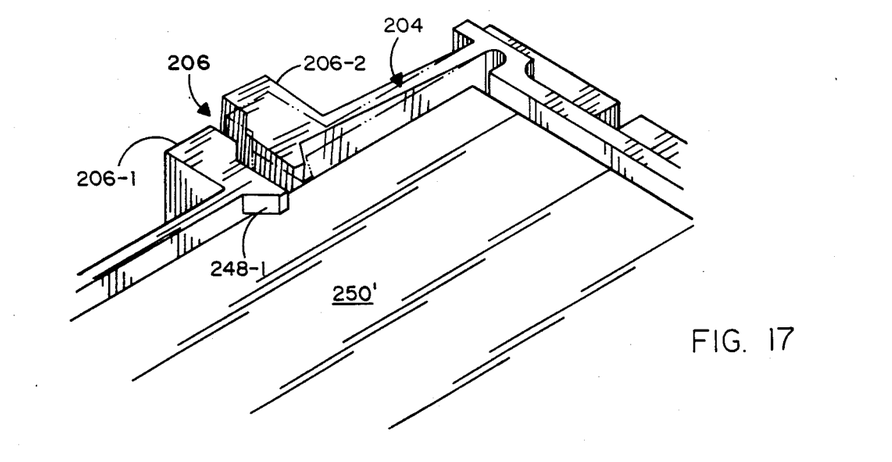

FIGS. 11 and 12 of the drawings shows a modified two-part pin grid array carrier 200 which is adapted to retain a pin grid array (not shown) therewithin. The pin grid array may be identical to that which was previously described when referring to FIG. 10 and, therefore, will not again be described. The modified carrier 200 is similar to the pin grid array carrier 12 which was previously described when referring to FIGS. 1-9. However, and as will be explained in greater detail hereinafter, carrier 200 is advantageously adapted to receive and retain therewithin pin grid array bodies having different thicknesses. More particularly, and like the earlier described carrier 12, the modified two-part carrier 200 has a generally rectangular outer frame 202 and a carrier insert 204 (best illustrated at FIG. 13) which is removably connected at the inside of outer frame 202. A pair of flexible retention fingers 206 (best illustrated in FIG. 14) extend from opposite end walls of the carrier insert 204. As is best illustrated in FIGS. 16 and 17, the retention fingers 206 overlap and engage the bottom face of the pin grid array body to retain the pin grid array at the carrier insert 204. Flexible clips 210 on the inside walls of the outer frame 202 are adapted to engage opposite outer edges of the carrier insert 204 in a snap lock to releasably retain the carrier insert 204 in the outer carrier frame 202.

The construction of the outer frame 202 is identical to that which was previously described when referring to the outer frame 16 of FIGS. 3-6. Therefore, only a brief description of outer frame 202 is provided hereat. Outer frame 202 includes end walls 211 and 212 and side walls 213 and 214 which are interconnected with one another to define the rectangular perimeter for a centrally disposed open space 215 in which to receive the carrier insert 204. A pair of the aforementioned flexible clips 210 are spaced apart from one another along the length of each side wall 213 and 214. Each clip 210 is positioned at the bottom of a respective elongated, resilient, spring-like lever arm (designated 70 in FIG. 6) which extends vertically from and along the inside face of the side walls 213 and 214. A narrow notch 216 is formed around each lever arm in the side walls 213 and 214 at a point from which such lever arm extends. Each notch 216 establishes an open space behind a corresponding lever arm and clip 210 to add a degree of flexibility and permit the arm to bend or rotate in a direction away from the carrier insert 204 when such insert is removably received by the outer frame 202. Each of the end walls 211 and 212 of the outer frame 202 includes a central projection 218 extending inwardly towards the central space 215 within the outer frame 202. Each projection 218 includes a recess 220 (best illustrated in FIG. 12) in which to receive an alignment tab 221 from carrier insert 204 for properly aligning insert 204 for removably receipt by the outer frame 202 within the central opening 215.

Figure 13:
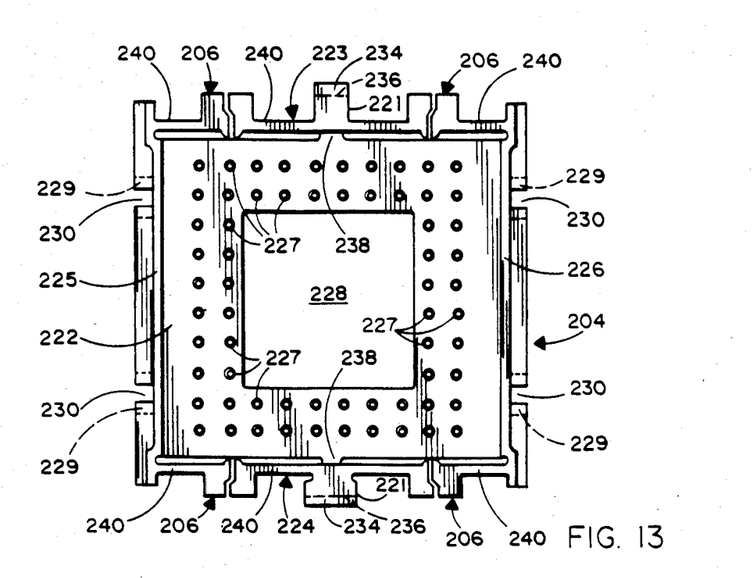
FIG. 13 is a top plan view showing the carrier insert of the pin grid array carrier.

Referring to FIG. 13 of the drawings, the construction of carrier insert 204 is now disclosed so that the details of the retention fingers 206 can be described for retaining pin grid arrays having different thicknesses. The carrier insert 204 includes a thin, flat base 222 having upright extending end walls 223 and 224 and side walls 225 and 226 which are interconnected with one another to define a rectangular perimeter around base 222. An array of holes 227 extends entirely through the base 222. The base is provided with a centrally disposed opening 228 to expose a pin grid array integrated circuit (not shown), and the holes 227 extend in a symmetrical grid pattern along each of the sides of the base 222 and around opening 228.

The carrier insert 204 includes a plurality of peripheral ramp surfaces 229, a pair of which are spaced from one another along each of the side walls 225 and 226. A rectangular notch 230 extends through each ramp 229 and into an outside edge of base 222. The ramps 229 have a width which is sufficient to cooperate with the projecting spring-biased, flexible clips 210 (of FIGS. 11 and 12) and the respective lever arms thereof to provide a cam surface to be engaged by the clips 210 for snap locking the carrier insert 204 inside the outer frame 202. By virtue of the notches 230, a suitable extraction tool (not shown) may be inserted under the ramps 229 and behind the clips 210 for the purpose of bending the clips away from base 222 so as to release their engagement from the ramps 229 when it is desirable to remove the carrier insert 204 from the surrounding outer frame 202.

A pair of center alignment tabs 221 (previously described when referring to FIG. 12) are located at opposite ends of the base 222. Each alignment tab 221 has a flanged outer tip 234 extending away from a downwardly facing right angle shoulder 236. In the assembled two-part carrier 200, the outer tips 234 of alignment tabs 221 are located within recesses 220 of central projections 218 (of FIG. 12) for suitably alignment carrier insert 204 for removable receipt within the outer frame 202. The center alignment tabs 221 are spaced from the edges of the base 222 by respective narrow necks 238 which are coextensively formed with the base and which support the alignment tabs outwardly therefrom.

Figure 14:
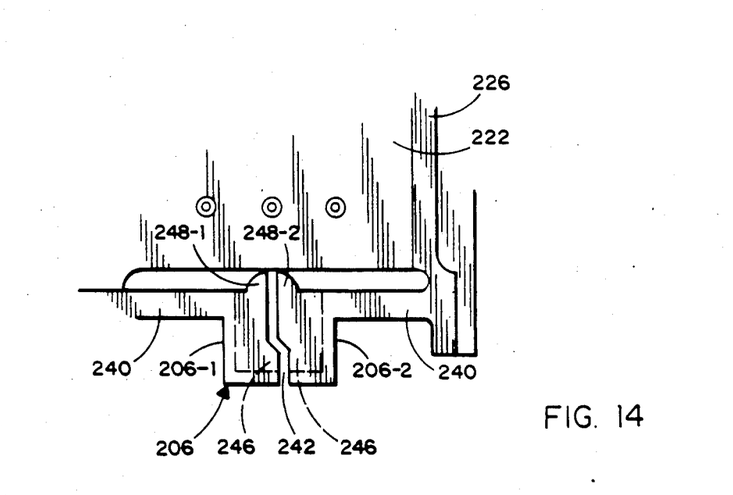
FIG. 14 is an enlarged detail of a corner portion of the carrier insert of FIG. 13.

In accordance with the present embodiment, and referring concurrently to FIGS. 13 and 14 of the drawings, each of the retention fingers 206 is supported by a pair of flexible, narrow, upright legs 204 which are spaced away from outer edges of carrier insert base 222. That is, a first leg 240 extends between center alignment tab 221 and one side of a retention finger 206. A second leg 240 extends from a second side of a retention finger 206 to a projection of side wall 225 or 226 which protrudes outwardly from a corner of the base 222. The legs 240 extend in perpendicular alignment with and between the projections of side walls 225 and 226. Thus, the upright legs 240 form the aforementioned side walls 223 and 224 at opposite ends of the carrier insert base 222.

To accommodate pin grid arrays (e.g. designated 14 in FIG. 10) having different thicknesses, each retention finger 206 is split into a first and second half 206-1 and 206-2. As is best illustrated in FIG. 14, each of the retention finger halves 206-1 and 206-2 is carried by a respective flexible leg 240 and separated from one another so that a short gap 242 is established therebetween. Each retention finger half 206-1 and 206-2 has an upwardly facing recessed area 246 formed therein. A pair of the recessed areas 246 are arranged side-by-side one another across the gap 242 to form a pocket, the purpose of which will soon be described.

Each retention finger half 206-1 and 206-2 also has a respective coextensively formed retaining tip 248-1 and 248-2. The retaining tips 248-1 and 248-2 project inwardly from the retention fingers 206 in a generally horizontal direction below the plane of the base 222 of carrier insert 204. As will soon be explained in greater detail, one or the other of the tips 248-1 or 248-2 from each of the pairs of retention finger halves 206-1 and 206-2 will be positioned to overlap and engage the body of a pin grid array to retain such pin grid array on the carrier insert base. Moreover, and as will also be explained, each of the retention finger halves 206-1 and 206-2 may be rotated on its flexible leg 240 in a generally horizontal direction outwardly and away from the base 222 under the application of an external bending force. Such external force is applied in and against the recessed areas 246 of the retention finger halves 206-1 and 206-2 when it is desirable to introduce to or remove the pin grid array from engagement by the retaining tips 248-1 and 248-2 at the carrier insert base 222.

Figure 15:
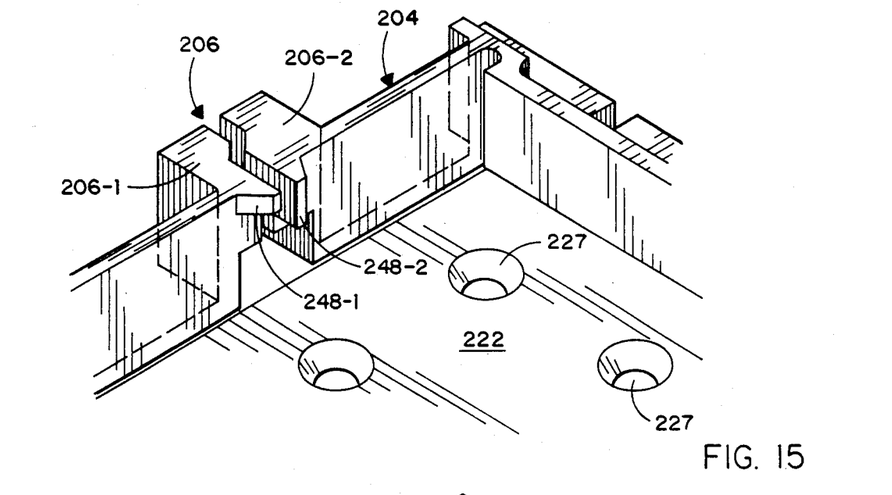
FIGS. 15–17 are perspective views to illustrate the operation of the carrier of FIG. 11 for retaining pin grid array bodies having different thicknesses.

The detailed operation of the split retention fingers 206 is now described while referring to FIGS. 15–17 of the drawings. Referring first to FIG. 15, a pair of retaining tips 248-1 and 248-2 are shown projecting inwardly towards the carrier insert base 222 from the respective halves 206-1 and 206-2 which form each retention finger 206. As earlier disclosed, the retaining tips 248-1 and 248-2 are aligned horizontally with and below the plane of base 222. Since all of the retention fingers 206 operate in a similar fashion, the following description will be limited to a single retention finger.

The retaining tips 248-1 and 248-2 are dimensioned differently, so that the depth of one of such tips (e.g. 248-1) is less than the depth of the other tip (e.g. 248-2). That is, the distance from the carrier insert base 222 to the retaining tip 248-1 of relatively short depth is greater than the distance from the base 222 from the retaining tip 248-2 of relatively larger depth. The advantage of independently rotatable retention finger halves 206-1 and 206-2 having respective retaining tips 248-1 and 248-2 of different depths for accommodating pin grid array bodies of different thicknesses will soon be apparent.

In FIG. 16, a pin grid array 250 is removably secured to the base of carrier insert 204 by means of the retention fingers 206 and the retaining tips 248-1 and 248-2 thereof. By way of a first example, the body of pin grid array 250 has a relatively narrow thickness. More particularly, and as earlier disclosed while referring to FIGS. 1–9, each of the retention finger halves 206-1 and 206-2 at opposite ends of the carrier insert 204 are simultaneously rotated horizontally outward and away from the carrier insert base 222 (in the direction of reference arrows 252) by the application of a suitable external bending force at and against the upward facing areas (designated 246 in FIG. 14) of such retention finger halves. With the finger halves simultaneously rotated, the pin grid array 250 is located on the carrier insert base, such that the pins of pin grid array 250 extend through the holes 227 in the base 222. Once the pin grid array is in place on the carrier insert base 222, the external bending force is removed, and the resiliency of the flexible legs 240 of the retention fingers 206 automatically returns the retention finger halves 206-1 and 206-2 in a direction towards their normal, unrotated position of FIG. 15.

With a narrowed bodied pin grid array 250 located on carrier insert base 222, the retaining tip 248-2 having a relatively long depth will be returned to its normal, unrotated position in overlapping engagement with the pin grid array 250 to releasably retain such pin grid array at the carrier insert 204. The other, shorter retaining tip 248-1 is likewise returned to its normal, unrotated position to overlap pin grid array 250. However, because of its shorter depth, the retaining tip 248-1 is spaced downwardly and away from the body of pin grid array 250.

In FIG. 17, and by way of a second example, a pin grid array 250' having a relatively large body thickness is located at the base 222 of carrier insert 204. In this case, the retaining tip 248-1 having a short depth will be returned to its normal, unrotated position in overlapping engagement with the pin grid array 250' to releasably retain such pin grid array at carrier insert 204. However, because of its relatively longer depth, the other retaining tip 248-2 will be unable to completely return to its normal unrotated position (as shown in phantom) after the pin grid array 250' has been located at carrier insert base 222. That is, the longer retaining tip 248-2 will remain in a partially rotated position outwardly from the carrier insert base and against an edge of pin grid array 250'.

After the pin grid array described in either of the examples of FIGS. 16 or 17 has been removably secured to the base of carrier insert 204, the carrier insert is ready to be removably connected by means of the previously snap lock at the inside of the outer frame (designated 202 in FIGS. 11 and 12) in a substantially identical manner to that which was previously described, particularly when referring to FIGS. 1–9. Moreover, when it is desirable to remove the pin grid array from carrier insert 204, the aforementioned bending tool may once more be used in the recessed areas 246 of retention finger halves 206-1 and 206-2 to again rotate such finger halves and thereby move one or the other of the retaining tips 248-1 and 248-2 out of overlapping engagement with the body of the pin grid array, whereupon such pin grid array may be easily removed.

While FIGS. 1–17 have described two-part carriers to which a pin grid array may be removably connected, many of the advantages of the aforementioned two-part carriers may be obtained by a unique one-part carrier which will now be disclosed. Therefore, in accordance with another preferred embodiment of the present invention, and referring now to FIGS. 18 and 19 of the drawings, such a unique one-part pin grid array carrier 300 is illustrated. Carrier 300 is similar to the two-part carriers of FIGS. 1–17, including a generally outer frame 302 and a relatively thin, flat base 304 located within outer frame 302 and having a centrally disposed opening 305 formed therein. However, in the present embodiment, the outer frame frame 302 and the base 304 are coextensively connected together to form a unitary pin grid array carrier 300. Therefore, the flexible clips (at the perimeter of the outer frame) and the angled ramp or notch portions (along the edge of the base) which are present in the two-part carriers of FIGS. 1–17 to create a snap lock for removably connecting the carrier base to an outer frame are eliminated in the one-part pin grid carrier embodiment of FIGS. 18–19. Inasmuch as the structure and operation of the outer frame and base members 302 and 304 are otherwise substantially identical to the carrier frame and base members of FIGS. 1–17, only a brief description thereof will again be provided.

Figure 18:
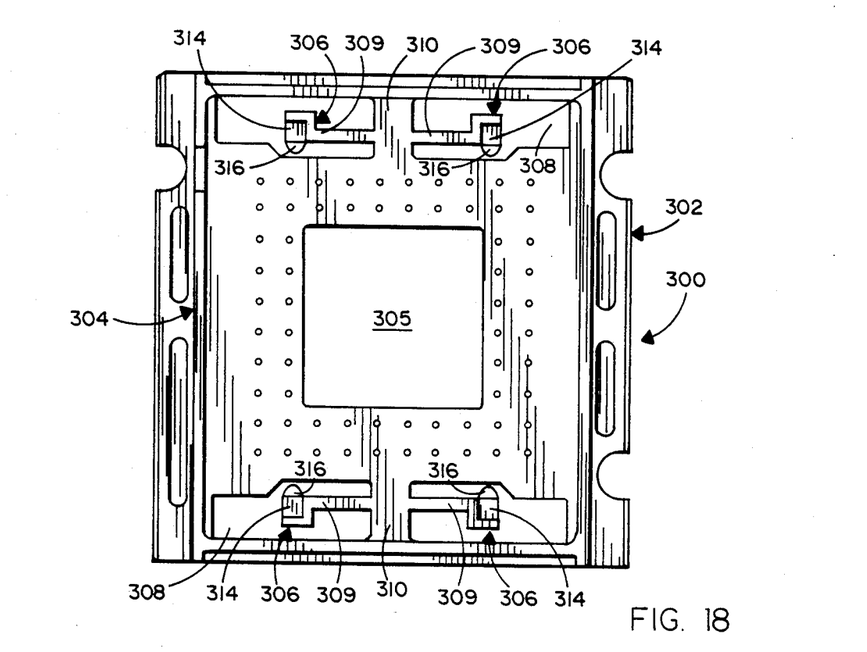
FIG. 18 is a top plan view showing a one-part pin grid array carrier according to principles of a third embodiment of this invention.

A pair of retention fingers 306 is located at opposite ends of the carrier 300 in access spaces 308. As will soon be explained, portions of the retention fingers 306 are positioned to overlap and engage the bottom face of a pin grid array (not shown) to retain the pin grid array at the carrier base 304. Each one of a pair of retention fingers is carried at the end of a narrow, flexible upright leg 309. A corresponding pair of such legs 309 are supported by and extend outwardly and in opposite directions from a respective one of a pair of narrow neck portions 310, so that the legs 309 are spaced away from the carrier base 304. Each of the neck portions 310 extends continuously between opposing ends of the outer frame 302 and carrier base 304, so as to complete the unitary pin grid array carrier 300. Each of the neck portions 310 also has a downwardly facing, right angle shoulder 312 (best illustrated in FIG. 19) which is connected at the inside face of outer frame 302 to support a pair of legs 309.

Figure 19:
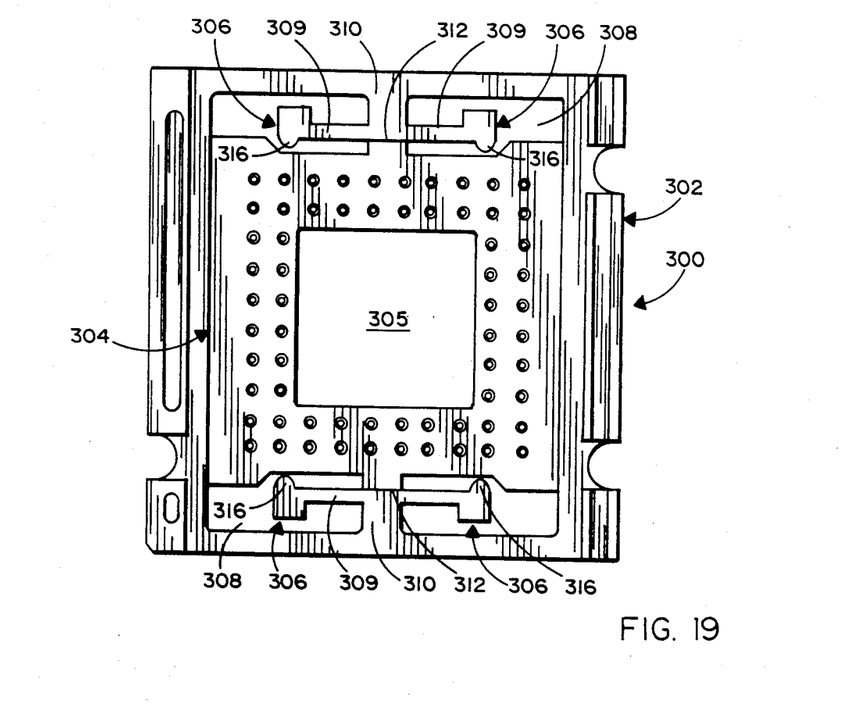
FIG. 19 is a bottom plan view showing the pin grid array carrier of FIG. 18.

Each retention finger 306 has an upwardly facing recessed area 314 (best illustrated in FIG. 18) formed therein. As with the two-part carrier embodiment of FIGS. 1–9, an external force applying tool may be located within each of the recessed areas 314 for bending the legs 309 and rotating the retention fingers 306 in a horizontal plane away from the ends of carrier base 304, so that a pin grid array may be attached to or removed from base 304. Also like the two-part carrier of FIGS. 1–9, each retention finger 306 includes a coextensively formed retaining tip 316. The retaining tips 316 project inwardly from the retention fingers 306 in a generally horizontal direction below the plane of the carrier base 304. Thus, the retaining tips 316 from each of the pairs of retention fingers 306 will overlap and engage the body of a pin grid array to retain such pin array at the base 304.

A one-part pin grid array carrier such as just described is typically manufactured as a continuously molded piece. Therefore, such a one-piece carrier may be desirable by high volume pin grid array users to minimize manufacturing (e.g. mold and labor) costs. Such a one-part carrier would also have maximized structural integrity because less bending forces are exerted upon a carrier base (i.e. 304) which is integrally connected to an outer frame (i.e. 302) relative to a base which is removably connected to the frame, as in a two-part carrier.

Figure 20:
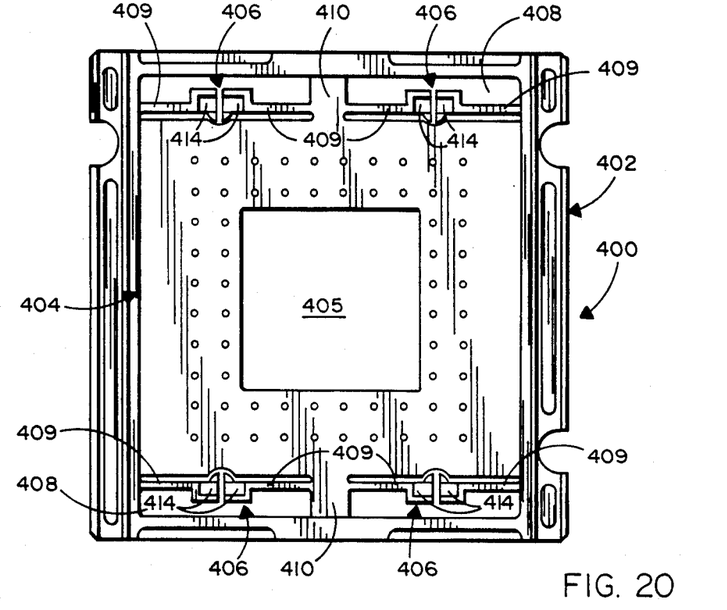
FIG. 20 is a top plan view showing a one-part pin grid array carrier according to the principles of a fourth embodiment of this invention.
Figure 21:
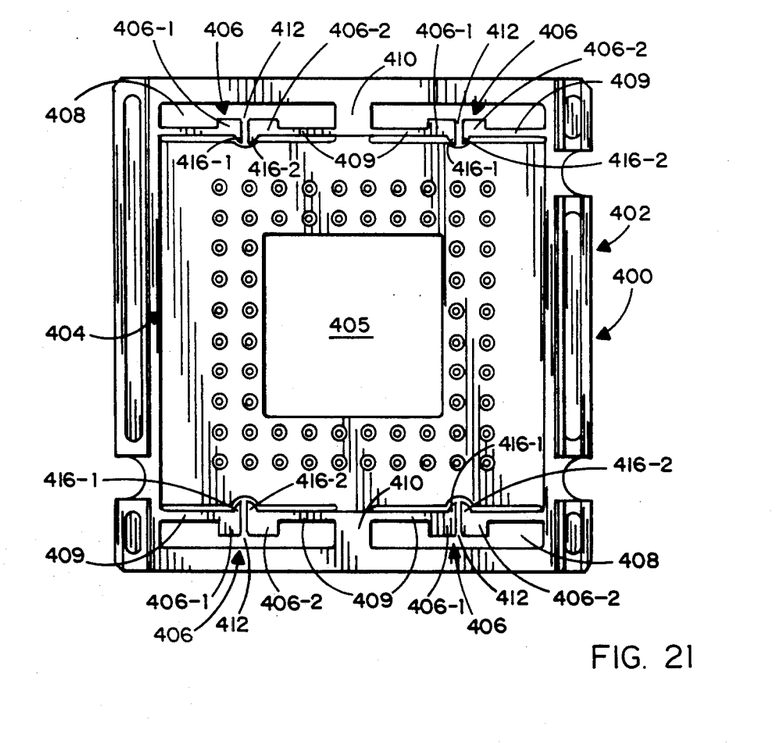
FIG. 21 is a bottom plan view showing the pin grid array carrier of FIG. 20.

In accordance with another preferred embodiment of the present invention, the one-part pin grid array carrier 300 of FIGS. 18 and 19 can be modified in the manner of the two-part pin grid array carrier (i.e. 200) of FIGS. 11–17 to include split retention fingers having separated retention finger halves. Therefore, as with the two-part carrier of FIGS. 11–17, such a modified one-part carrier would advantageously be adapted to receive and retain pin grid array bodies having different thicknesses. Accordingly, and referring to FIGS. 19 and 20 of the drawings, a one-part pin grid array carrier 400 is illustrated which is capable of achieving the manufacturing cost savings, which is characteristic of the one part carrier of FIGS. 18 and 19, as well as the ability to removably retain pin grid arrays having different sizes, which is characteristic of the two-part carrier of FIGS. 11–17. Inasmuch as the one-part pin grid array carrier 400 of FIGS. 18 and 19 is substantially similar in structure and operation to the carriers previously described while referring to FIGS. 11–19, only a brief description will again be provided.

Like the one-part pin grid carrier (i.e. 300) of FIGS. 18 and 19, carrier 400 includes a rectangular outer frame 402 and a relatively thin, flat base 404 located within the frame and having a centrally disposed opening 405 formed herein. The outer frame 402 and the base 404 are coextensively connected together to form a unitary pin grid array carrier 400. A pair of retention fingers 406 is located at opposite ends of the carrier 400 in access space 408, so that portions of such fingers will be positioned to overlap and engage the bottom face of pin grid array (not shown) to retain the pin grid array at the carrier base 404.

Like the two-part pin grid array carrier (i.e. 200) of FIGS. 11–17, each of the retention fingers 406 is split into a first and second half 406-1 and 406-2. The retention finger halves are carried by respective flexible legs 409 and separated from one another by a short gap 412. The legs 409 extend across the access space 408 and are supported by a neck 410 which is coextensively formed with opposing ends of the outer frame 402 and base 404. Each retention finger half 406-1 and 406-2 has an upwardly facing recessed area 414 formed therein (best illustrated in FIG. 20) for receiving an external force applying tool which, as previously described, is adapted to apply a bending force to the legs 409, so as to rotate retention finger halves 406-1 and 406-2 independently of one another in a horizontal direction, outwardly and away from carrier base 404.

Each of the retention finger halves 406-1 and 406-2 also has a respective coextensively formed retaining tip 416-1 and 416-2. The retaining tips project inwardly from the retention fingers 406 in a horizontal direction below the plane of the carrier base 404. When the aforementioned external bending force is removed from the recessed areas 414 of retention finger halves 406-1 and 406-2, the resiliency of the flexible legs 409 automatically returns the previously rotated finger halves in a horizontal direction towards the carrier base 404, such that one or the other of the retaining tips 416-1 or 416-2 will overlap and engage the body of a pin grid array to retain the pin grid array on the base 404. The retaining tips 416-1 and 416-2 are dimensioned differently (i.e. have different depths) relative to one another, so as to be advantageously adapted to engage respective pin grid array bodies having different thicknesses. The detailed structure and operation of the split retention fingers 406 and the retaining tips 416-1 and 416-2 thereof for removably securing pin grid array bodies of different sizes to the carrier base 404 are identical to the structure and operation previously described when referring to FIGS. 15–17 and, accordingly, will not again be described hereat.

It will be apparent that while the preferred embodiments of the invention have been shown and described, various modifications and changes may be made without departing from the true spirit and scope of the invention.

Having thus set forth the preferred embodiments of the present invention, what is claimed is:

1. A one-part carrier for a pin grid array having a body with a plurality of pins projecting from at least one face thereof, said carrier comprising:
   an outer frame having side walls extending around the perimeter of an open space within said frame;
   a carrier base for supporting the body of the pin grid array, said carrier base integrally connected to said frame inside the open space thereof and having an array of holes through which the pins project when the pin grid array is supported on said base; and
   flexible retention fingers having means for engaging the body of a supported pin grid array for releasably retaining the pin grid array on said base, said retention fingers being bendable against their normal bias in a direction away from said carrier base for releasing the engagement of said pin grid array body to remove the body from said base.

2. The one-part carrier recited in claim 1, wherein each of said retention fingers has a recessed area formed therein by which said fingers can be engaged by an external force applying means for bending said fingers away from said carrier base to release the engagement of the pin grid array on said base.

3. The one-part carrier recited in claim 1, including a neck portion interconnected between said outer frame and said carrier base at opposite ends of said carrier, a pair of said retention fingers extending outwardly and in opposite directions from each neck portion so as to be located adjacent said base and in the open space within said carrier frame.

4. The one-part carrier recited in claim 1, wherein each of said retention fingers includes a retaining tip projecting inwardly toward and being spaced below said carrier base, said retaining tips overlapping and engaging said pin grid array body when the pin grid array is supported on said base.

5. The one-part carrier recited in claim 1, wherein each of said retention fingers includes first and second retaining tips projecting inwardly towards and being spaced below said carrier base, said first and second retaining tips formed so that the distance between said base and said first retaining tip is different from the distance between said base and said second retaining tip, said first and second retaining tips overlapping and engaging respective pin grid array bodies of different thicknesses when one of such bodies is supported on said base.

6. The one-part carrier recited in claim 1, wherein each of said retention fingers is split into first and second finger sections for engaging and releasably retaining the pin grid array on said carrier base, said first and second finger sections being located on respective resilient legs, said legs being bendable independently of one another in a direction away from said carrier base for rotating said finger sections out of engagement with the pin grid array body on said base.

7. The one-part carrier recited in claim 6, wherein each of said first and second retention finger sections includes respective retaining tips projecting inwardly towards and being spaced below said carrier base, said retaining tips having different depths so that the distance between said base and a first said retaining tips is different from the distance between said base and the second of said retaining tips, said first and second retaining tips overlapping and engaging respective pin grid array bodies of different thicknesses when one of such bodies is supported on said base.

8. The one-part carrier recited in claim 6, wherein each of said first and second retention finger sections has a recessed area formed therein by which said finger sections can be engaged by an external force applying means for bending said resilient legs and rotating said finger sections out of engagement with the pin grid array body on said carrier base.

9. A two-part carrier for a pin grid array having a body with a plurality of pins projecting from at least one face of the body, said two-part carrier comprising:
   an outer frame having side walls extending around the perimeter of an open space within the frame;
   a carrier insert having a base for supporting the body of the pin grid array, said base including an array of holes through which the pins project when the body of the pin grid array is supported on said base;
   releasable fastening means cooperating between said carrier insert and the side walls of said outer frame for attaching said carrier insert to said outer frame within the open space thereof with the pin grid array supported on said carrier insert base; and flexible retention fingers having respective retaining tips projecting inwardly toward and being spaced below said carrier insert base for overlapping and engaging the body of a supported pin grid array for releasably retaining the pin grid array on said base, said retention fingers being bendable against their normal bias in a direction away from said carrier base for releasing the engagement of said pin grid array body to remove the body from said base.

10. The two-part carrier recited in claim 9, wherein each of said retention fingers includes first and second retaining tips projecting inwardly towards and being spaced below said carrier insert base, said first and second retaining tips formed so that the distance between said base and said first retaining tip is different from the distance between said base and said second retaining tip, said first and second retaining tips overlapping and engaging respective pin grid array bodies of different thicknesses when one of such bodies is supported on said base.

11. The two-part carrier recited in claim 9, wherein each of said retention fingers is split into first and second finger sections having respective retaining tips for engaging and releasably retaining the pin grid array body on said carrier insert base, said first and second finger sections being located on respective resilient legs, said legs being bendable independently of one another in a direction away from said carrier base for rotating said retaining tips out of engagement with the pin grid array body on said base.

12. The two-part carrier recited in claim 11, wherein each of the respective retaining tips of said first and second retention finger sections projects inwardly towards and is spaced below said carrier insert base, said retaining tips having different depths so that the distance between said base and a first of said retaining tips is different from the distance between said base and the second of said retaining tips, said first and second retaining tips overlapping and engaging respective pin grid array bodies of different thicknesses when one of such bodies is supported on said base.

13. The two-part carrier recited in claim 11, wherein each of said first and second retention finger sections has a recessed area formed therein by which said finger sections can be engaged by an external force applying means for bending said resilient legs and rotating said retaining tips out of engagement with the pin grid array body on said carrier insert base.

14. The two-part carrier recited in claim 9, wherein said releasable fastening means comprise flexible spring-biased clips carried on the side walls of said outer frame and cooperating peripheral edge surfaces at the base of said carrier insert for releasably engaging said spring-biased clips in a snap lock.

15. The two-part carrier recited in claim 14, further comprising notched areas formed in the side walls of said outer frame for establishing spaces through which to bend respective ones of said flexible, spring-biased clips when attaching said carrier insert to said outer frame.

16. The two-part carrier recited in claim 14, wherein the peripheral edge surfaces of said carrier insert base for releasably engaging said spring-biased clips include sloping cam surfaces over which said clips can ride when moving into snap lock engagement with said edge surfaces.

17. The two-part carrier recited in claim 16, further comprising notched areas formed within and extending below the cam surfaces at said carrier insert base, said notched areas receiving therein an external force applying tool for bending said spring-biased clips out of snap lock engagement with said cooperating peripheral edge surfaces.

18. The two-part carrier recited in claim 9, further comprising indexing means cooperating between said carrier insert base and the side walls of said outer frame to prevent relative movement between said base and frame when said base is attached to said frame.

19. The two-part carrier recited in claim 18, wherein said indexing means comprise at least one tab projecting outwardly from said carrier insert base and a cooperating recess formed at said outer frame for removable receipt of said tab.

20. A carrier for supporting pin grid arrays having respective bodies of different thicknesses relative to one another and a plurality of pins projecting from at least one face of the bodies, said carrier comprising:

a base for supporting the body of a pin grid array, said base having an array of holes through which the pins project when a pin grid array is supported on said base, and a plurality of flexible retention means extending below said base for engaging the body of a supported pin grid array for releasably retaining said pin grid array on said base, said retention means being spaced from said base, such that the distance between said base and some of said retention means is different from the distance between said base and other of said retention means, said some and the other of said retention means engaging respective pin grid array bodies of different thicknesses when said bodies are supported on said base.

21. A carrier recited in claim 20, wherein each of said retention means includes a resilient leg, said legs being bendable independently of one another in a direction away from said carrier base for rotating said retention means out of engagement with a pin grid array body being supported on said base.

* * * * *